US008819517B1

(12) United States Patent
Li et al.

(10) Patent No.: US 8,819,517 B1
(45) Date of Patent: Aug. 26, 2014

(54) SYSTEMS AND METHODS FOR A TURBO DECODER IN A UNIVERSAL MOBILE TELECOMMUNICATION SYSTEM (UMTS)

(75) Inventors: Yuan Li, San Diego, CA (US); Tao Zhang, San Diego, CA (US); Jianbin Zhu, Poway, CA (US)

(73) Assignee: Intel Corporation, Santa Clara, CA (US)

( * ) Notice: Subject to any disclaimer, the term of this patent is extended or adjusted under 35 U.S.C. 154(b) by 291 days.

(21) Appl. No.: 13/006,359

(22) Filed: Jan. 13, 2011

Related U.S. Application Data

(63) Continuation-in-part of application No. 12/986,138, filed on Jan. 6, 2011, now abandoned.

(51) Int. Cl.
*H03M 13/00* (2006.01)
*H03M 13/39* (2006.01)
*H03M 13/11* (2006.01)

(52) U.S. Cl.
CPC ...... *H03M 13/3905* (2013.01); *H03M 13/1105* (2013.01); *H03M 13/1111* (2013.01); *H03M 13/1114* (2013.01); *H03M 13/1117* (2013.01); *H03M 13/1137* (2013.01)
USPC ........................... 714/755; 714/752; 714/758

(58) Field of Classification Search
CPC ............ H03M 13/00; H03M 13/1111; H03M 13/1114; H03M 13/114; H03M 13/1105
USPC .................. 714/752, 755, 758, 767
See application file for complete search history.

(56) References Cited

U.S. PATENT DOCUMENTS

| 6,594,792 | B1 | 7/2003 | Hladik et al. |
| 6,718,504 | B1 * | 4/2004 | Coombs et al. ............... 714/755 |
| 6,993,704 | B2 | 1/2006 | Wolf |
| 7,185,260 | B2 | 2/2007 | Coombs et al. |
| 7,200,799 | B2 | 4/2007 | Wang et al. |
| 7,849,377 | B2 | 12/2010 | Hekstra et al. |
| 8,250,448 | B1 | 8/2012 | Andrews |
| 2007/0061666 | A1 | 3/2007 | Nakai |
| 2007/0101231 | A1 | 5/2007 | Kutz et al. |
| 2007/0234180 | A1 | 10/2007 | Edmonston et al. |
| 2008/0092010 | A1 | 4/2008 | Orio |
| 2008/0270868 | A1 | 10/2008 | Shinagawa et al. |
| 2009/0300463 | A1 | 12/2009 | Purkovic et al. |
| 2011/0107019 | A1 | 5/2011 | Pan et al. |
| 2013/0156133 | A1 * | 6/2013 | Gentile et al. ............... 375/340 |

OTHER PUBLICATIONS

Kim et al., IEEE Transactions on Circuits and Systems "Double-Binary Circular Turbo Decoding Based on Border Metric Encoding", vol. 55, No. 1, Jan. 2008, pp. 79-83.

* cited by examiner

*Primary Examiner* — Sam Rizk

(57) ABSTRACT

According to some embodiments of the invention, a turbo decoder in a Universal Mobile Telecommunication System (UMTS) is provided, the turbo decoder comprising: a plurality of maximum a posteriori (MAP) engines; a first plurality of extrinsic memory banks and a second plurality of extrinsic memory banks; and wherein each of the first and second pluralities of extrinsic memory banks is accessible by at least one of the plurality of MAP engines, and wherein each of the first and second pluralities of extrinsic memory banks is configured to organize data according to a R×C matrix having a format similar to that of an interleaver table. During decoding, the first and second pluralities of extrinsic memory banks may be accessed for data by a MAP engine such that the first and second pluralities of extrinsic memory banks function as an interleaver or a de-interleaver of extrinsic information within the turbo decoder.

16 Claims, 13 Drawing Sheets

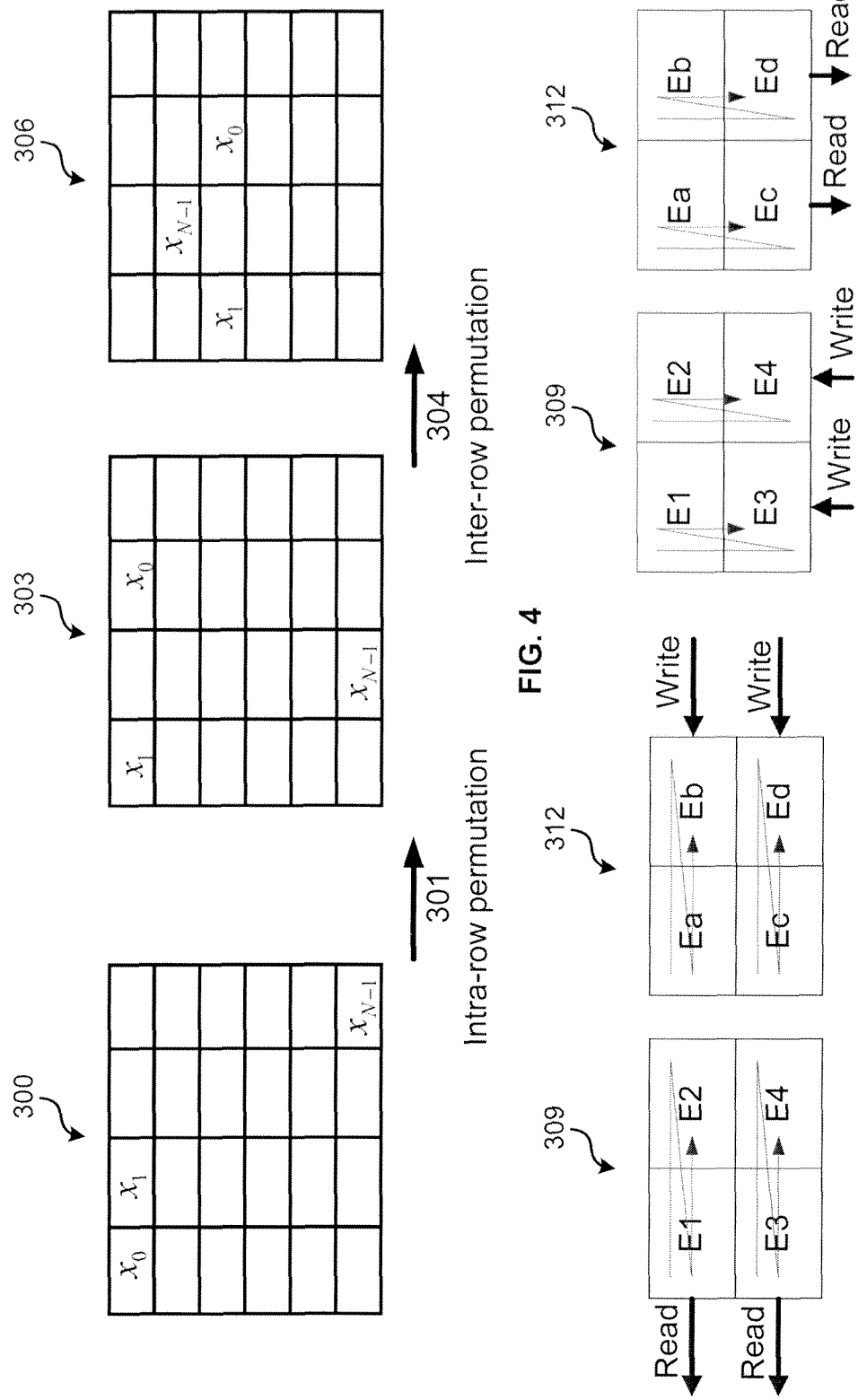

SYSTEMS AND METHODS FOR A TURBO DECODER IN A UNIVERSAL MOBILE TELECOMMUNICATION SYSTEM (UMTS)

CROSS-REFERENCE TO RELATED APPLICATIONS

This application is a continuation-in-part and claims the benefit of U.S. application Ser. No. 12/986,138, filed Jan. 6, 2011, which is hereby incorporated herein by reference in its entirety.

FIELD OF THE INVENTION

The present invention relates to radio communications, and more particularly, some embodiments relate to memory contention and turbo decoders in a Universal Mobile Telecommunication System (UMTS).

DESCRIPTION OF THE RELATED ART

Turbo decoders facilitate communication for a number of different radio communication technologies, including UMTS, WCDMA/HSDPA. In order to speed up data decoding, some traditional turbo decoders utilize two or more maximum a posteriori (MAP) engines to decode one code block at the same. However, due to random nature of interleavers utilized in traditional turbo decoders, the two or more MAP engines may access the extrinsic and systematic information memory banks at the same time, thereby resulting in memory contention and slowing down decoding speed. FIGS. 1A and 1B illustrate two such situations.

FIG. 1A is a diagram illustrating extrinsic memory contention within a traditional turbo decoder comprising two MAP engines, while FIG. 1B is a diagram illustrating systematic memory contention within a traditional turbo decoder comprising two MAP engines. Specifically, FIG. 1A illustrates how, during a half-iteration (e.g., even or odd half-iteration) of the decoding process, Upper MAP engine 10 and Lower MAP engine 13, due to the operation of interleaver 16 and interleaver 19 respectively, write to lower extrinsic memory bank 25 simultaneously. This results in an extrinsic memory contention between Upper MAP engine 10 and Lower MAP engine 13. Similarly, FIG. 1B illustrates how, during an odd half-iteration of the decoding process, Upper MAP engine 11 and Lower MAP engine 14, due to the operation of interleaver 37 and interleaver 34 respectively, read from systematic memory bank 43 simultaneously. This results in a systematic memory contention.

FIG. 2 provides one approach by which some traditional turbo decoders avoid such extrinsic and systematic memory contention. The diagram of FIG. 2 illustrates the dataflow for the traditional turbo decoder 101 during even half-iteration 100, and during odd half-iteration 103. During even half-iteration 100, Upper MAP engine 109 receives input from systematic memory bank-1 (115), parity-1 memory bank-1 (118), and extrinsic memory bank a-1 (163), and outputs extrinsic information to extrinsic memory bank b-1 (127), or outputs a hard decision to output memory bank-1 (133). During even half-iteration 100, Lower MAP engine 112 receives input from systematic memory bank-2 (121), parity-1 memory bank-2 (124), and extrinsic memory bank a-2 (166), and outputs extrinsic information to extrinsic memory bank b-2 (130), or outputs a hard decision to output memory bank-2 (136).

During odd half-iteration 103, interleaver 154 receives data from systematic memory bank-1 (115) and parity-1 memory bank-2 (124) through first-in-first-out (FIFO) buffers 148, interleaves the data, and outputs the interleaved data into Upper MAP engine 109 and Lower MAP engine 112 as inputs. During odd half-iteration 103, interleaver 151 receives data from extrinsic memory bank b-1 (127) and extrinsic memory bank b-2 (130) through FIFO buffers 145, interleaves the data, and outputs the interleaved data into Upper MAP engine 109 and Lower MAP engine 112 as inputs. During odd half-iteration 103, Upper MAP engine 109 also receives parity-2 memory bank-1 (118) as an input, and Lower MAP engine 112 also receives parity-2 memory bank-2 (124).

As output, during odd half-iteration 103, Upper MAP engine 109 and Lower MAP engine 112 outputs into de-interleaver 157 that de-interleaves the data received, and outputs the de-interleaved data to extrinsic memory bank a-1 (163) and extrinsic memory bank a-2 (166) via FIFO buffers 180.

BRIEF SUMMARY OF EMBODIMENTS OF THE INVENTION

According to various embodiments of the invention, systems, methods, and apparatuses are provided for turbo decoding in a Universal Mobile Telecommunication System (UMTS). Specifically, some embodiments of the invention are configured to avoid extrinsic or systematic memory contention within a turbo decoder comprising multiple MAP engines. Some such embodiments accomplish this by configuring and utilizing memory banks within the turbo decoder in accordance with memory partition designs and interleaver designs of the present invention.

According to an embodiment of the invention, a turbo decoder in a Universal Mobile Telecommunication System (UMTS) is provided, the turbo decoder comprising: a plurality of maximum a posteriori (MAP) engines; a first plurality of extrinsic memory banks and a second plurality of extrinsic memory banks; and wherein each of the first and second pluralities of extrinsic memory banks is accessible by at least one of the plurality of MAP engines, and wherein each of the first and second pluralities of extrinsic memory banks is configured to organize data according to a R×C matrix having a format similar to that of an interleaver table. Accordingly, when data is stored (R rows and C columns) or retrieved in the extrinsic memory banks, it is stored and received according to the R×C matrix. In some embodiments, during decoding, the first and second pluralities of extrinsic memory banks are accessed for data (i.e., for reading data or writing data) by the at least the one of the plurality of MAP engines such that the first and second pluralities of extrinsic memory banks function as an interleaver or a de-interleaver of extrinsic information within the turbo decoder. In doing so, for some embodiments, memory contention is resolved without using additional memory or using a first-in-first-out (FIFO) buffer.

For some embodiments, the interleaver table is formatted in accordance with a 3rd Generation Partnership Project (3GPP) standard. For example, the 3rd Generation Partnership Project (3GPP) standard may include Wideband Code Division Multiple Access (WCDMA) and High-Speed Downlink Packet Access (HSDPA). For example, the R×C matrix may store be such that R is less than or equal to 20 rows, and C is less than or equal to 256 columns, in accordance with 3GPP standards.

In some embodiments, the plurality of MAP engines comprises N MAP engines, and where the turbo decoder is configured such that during decoding: in a first half of a decoding iteration, the N MAP engines read data from the first plurality of extrinsic memory banks row by row according to a first predetermined sequence, and write data to the second plurality of extrinsic memory banks row by row according to the first predetermined sequence; and in a second half of the decoding iteration, the N MAP engines read data from the second plurality of extrinsic memory banks column by column according to a second predetermined sequence, and write data to the first plurality of extrinsic memory banks column by column according to the second predetermined sequence. The first half of the decoding iteration may be an even half-iteration, and the second half of the decoding iteration may be an odd half-iteration.

In other embodiments, the plurality of MAP engines comprises N MAP engines, wherein the R×C matrix of each of the first and second pluralities of extrinsic memory banks is partitioned into a N×N memory matrix such that each of the first and second pluralities of extrinsic memory banks comprises N row groupings of R/N rows of extrinsic memory and N column groups of C/N columns of extrinsic memory, and wherein the turbo decoder is configured such that during decoding: in a first half of a decoding iteration, a kth MAP engine of the N MAP engines reads data from a kth row grouping of the first plurality of extrinsic memory banks by row according to a first predetermined sequence, and writes data to a kth row grouping of the second plurality of extrinsic memory banks by row according to the first predetermined sequence, for k=1, 2, 3, 4, . . . N; and in a second half of the decoding iteration, the kth MAP engine of the N MAP engines reads data from a kth column grouping of the second plurality of extrinsic memory banks by column according to a second predetermined sequence, and writes data to a kth column grouping of the first plurality of extrinsic memory banks by column according to the second predetermined sequence, for k=1, 2, 3, 4, . . . N. The first predetermined sequence may be, for example, left to right within a row, while the second predetermined sequence may be, for example, top to bottom.

In various embodiments, the first plurality of extrinsic memory banks and the second plurality of the extrinsic memory banks are the same plurality of extrinsic memory banks. For example, the first or second plurality of extrinsic memory banks may comprise a dual-port memory bank such that the same plurality of extrinsic memory banks can be utilized as the first plurality of extrinsic memory banks and the second plurality of extrinsic memory banks.

In further embodiments, in order to avoid systematic memory contention, the turbo decoder further comprises: a plurality of systematic memory banks; a plurality of parity memory banks; and wherein the turbo decoder is configured such that during decoding: in a first half of a decoding iteration, a MAP engine of the plurality of MAP engines: (i) receives as input systematic bits $s_i$ from a systematic memory bank of the systematic memory banks, a priori data $e_i$ from the first plurality of extrinsic memory banks, and parity-1 bits $p_i$ from a first parity memory bank of the plurality of parity memory banks, (ii) generates $v'_i=s_i+e'_i$, and (iii) stores $v'_i$ in the second plurality of extrinsic memory banks, where $e'_i$ is the extrinsic information generated by the MAP engine during the first half of the decoding iteration, and in a second half of a decoding iteration, the MAP engine: (iv) receives as input interleaved data $v_j$ from the second plurality of extrinsic memory banks, and parity-2 bits $p_j$ from a second parity memory bank of the plurality of parity memory banks, (v) generates extrinsic data $e'_j$, and (vi) stores $e'_j$ in the first plurality of extrinsic memory banks.

In particular embodiments, various operations described above are implemented as methods for turbo decoders, or methods that are implemented into other hardware, such as a computer system, which allows the hardware to perform operations in accordance with the operations described.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 4 is a diagram illustrating an example interleaving or de-interleaving of data in accordance with one embodiment of the present invention.

FIGS. 5A and 5B are diagrams illustrating methods for partitioning and accessing extrinsic memory banks according to one embodiment of the present invention.

DETAILED DESCRIPTION OF THE EMBODIMENTS OF THE INVENTION

The present invention is directed toward systems, methods, and apparatuses relating to memory contention and turbo decoders in a Universal Mobile Telecommunication System (UMTS).

Figure 1A:
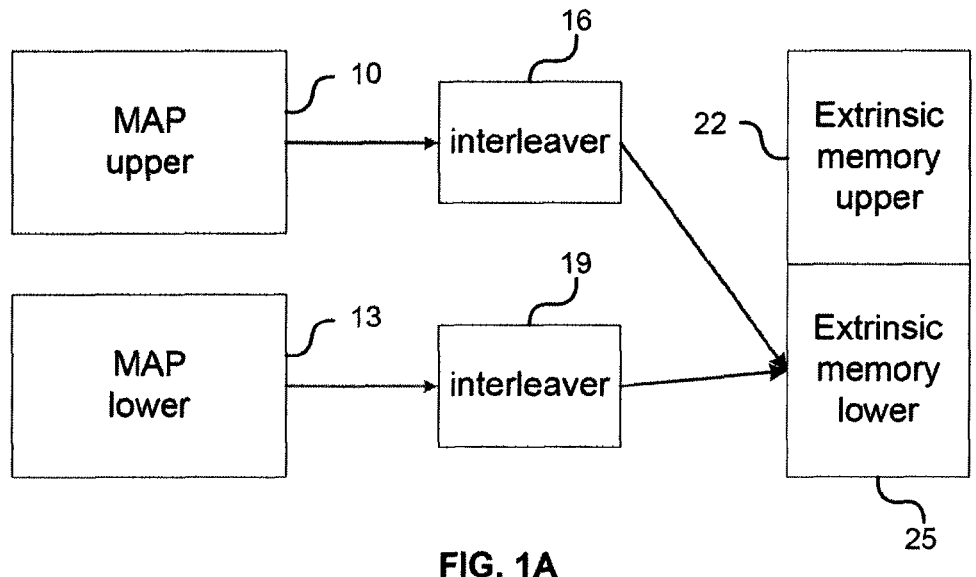
FIG. 1A is a diagram illustrating extrinsic memory contention within a turbo decoder.
Figure 1B:
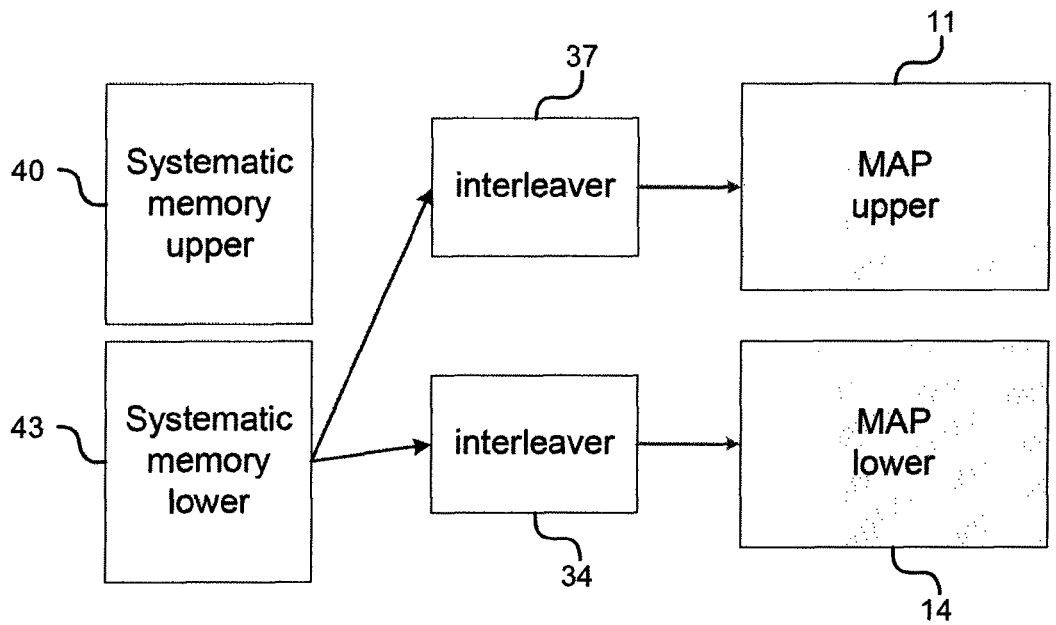
FIG. 1B is a diagram illustrating systematic memory contention within a turbo decoder.
Figure 2:
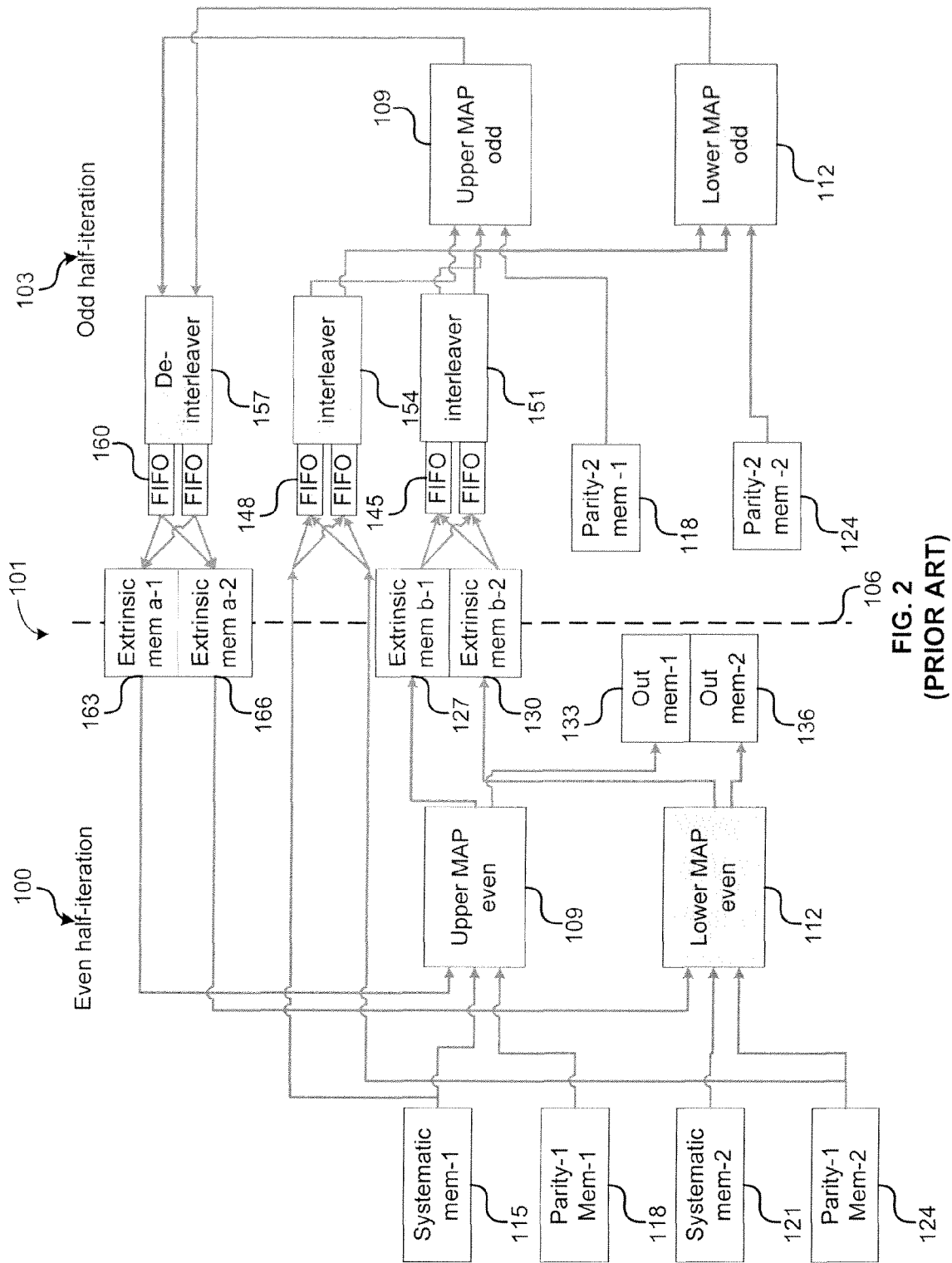
FIG. 2 is a diagram illustrating a traditional turbo decoder configured to avoid extrinsic and systematic memory contention.
Figure 3A:
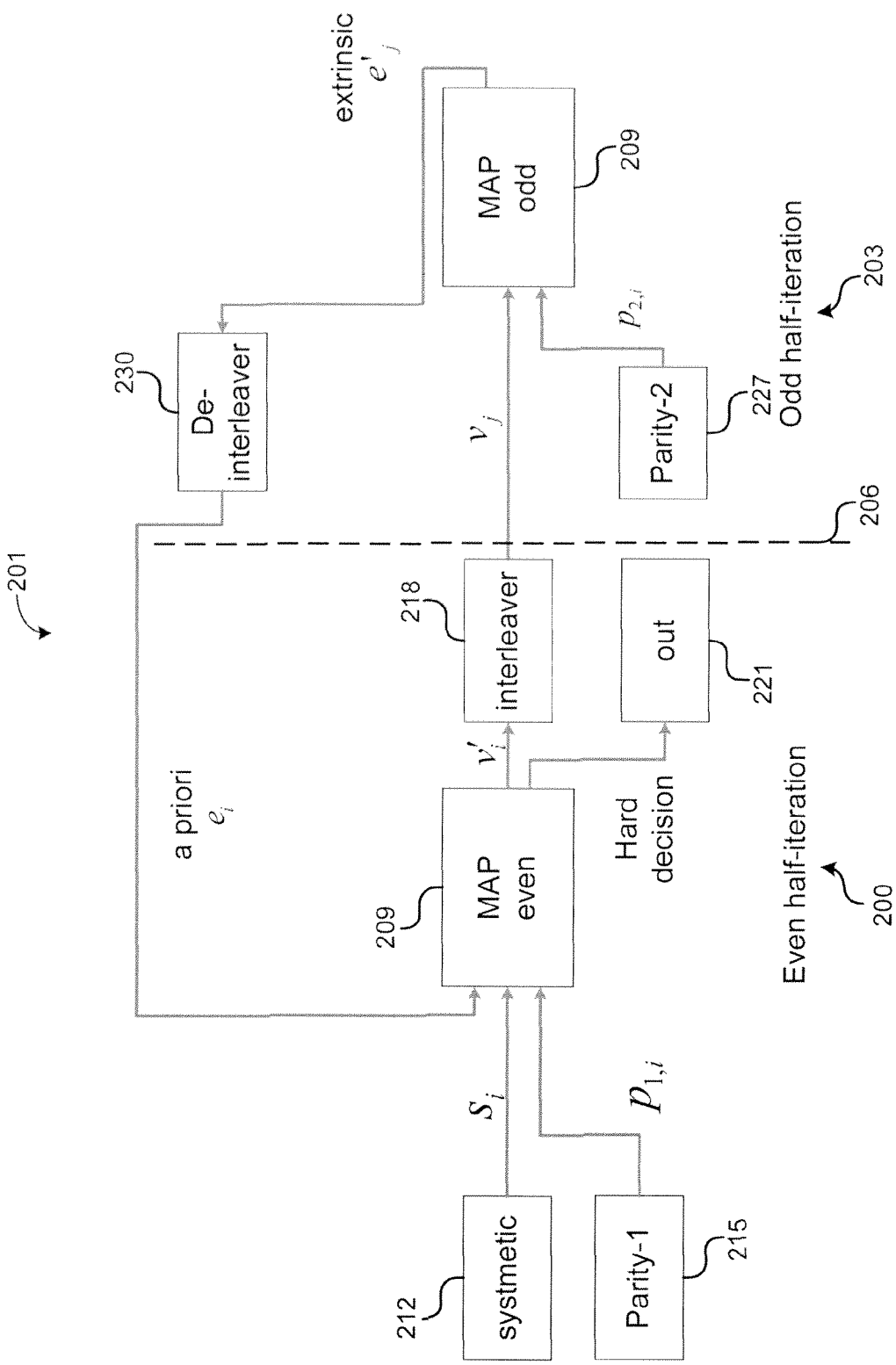
FIG. 3A is diagram illustrating an example turbo decoder according to one embodiment of the present invention that avoids systematic memory contention.

FIG. 3A is diagram illustrating an example turbo decoder 201, in accordance with one embodiment, that avoids systematic memory contention. As illustrated, during the even half-iteration 200, the turbo decoder algorithm takes in as input systematic bits $s_i$ from systematic memory bank 212, a priori information $e_i$ from de-interleaver 230, and parity-1 bits $p_{1,i}$ from parity-1 memory bank 215 as inputs. According to some embodiments, the de-interleaver 230 is a plurality of extrinsic memory banks that is organized and operates as a de-interleaver within the illustrated turbo decoder in accordance with the invention.

In the illustrated embodiment, MAP engine 209 then generates $v'_i = s_i + e'_i$ (rather than $e'_i$) as an output, which is subsequently stored in interleaver 218. Like the de-interleaver, according to some embodiments, the interleaver 218 is a plurality of extrinsic memory banks that is organized and operates as an interleaver within the illustrated turbo decoder in accordance with the invention. No interleaving is required for systematic bits and parity-1 bits. Additionally, in some embodiments, interleaver 218 and de-interleaver 230 may be implemented into the same plurality of extrinsic memory banks.

During the odd half-iteration 203, only $v_i = s_i + e_i$ from the last half-iteration is taken as input and extrinsic information is generated as output $e'_i$. In the illustrated embodiment, this accomplished by MAP engine 209 receiving as input $v_j$ from interleaver 218 and parity-2 bits $p_{2,i}$ from parity-2 memory bank 227, and generating $e'_j$ as output. The output $e'_j$ is subsequently stored into de-interleaver 230 for use during the next even half-iteration of the decoding process.

By performing decoding according to FIG. 3A, some embodiments avoid accessing systematic bits during the odd half-iteration of the decoding process and, thus, do not require systematic bits to be interleaved; this effectively prevents a systematic memory contention from occurring, and leaves only the extrinsic information to be interleaved and de-interleaved during the decoding process.

Figure 3B:
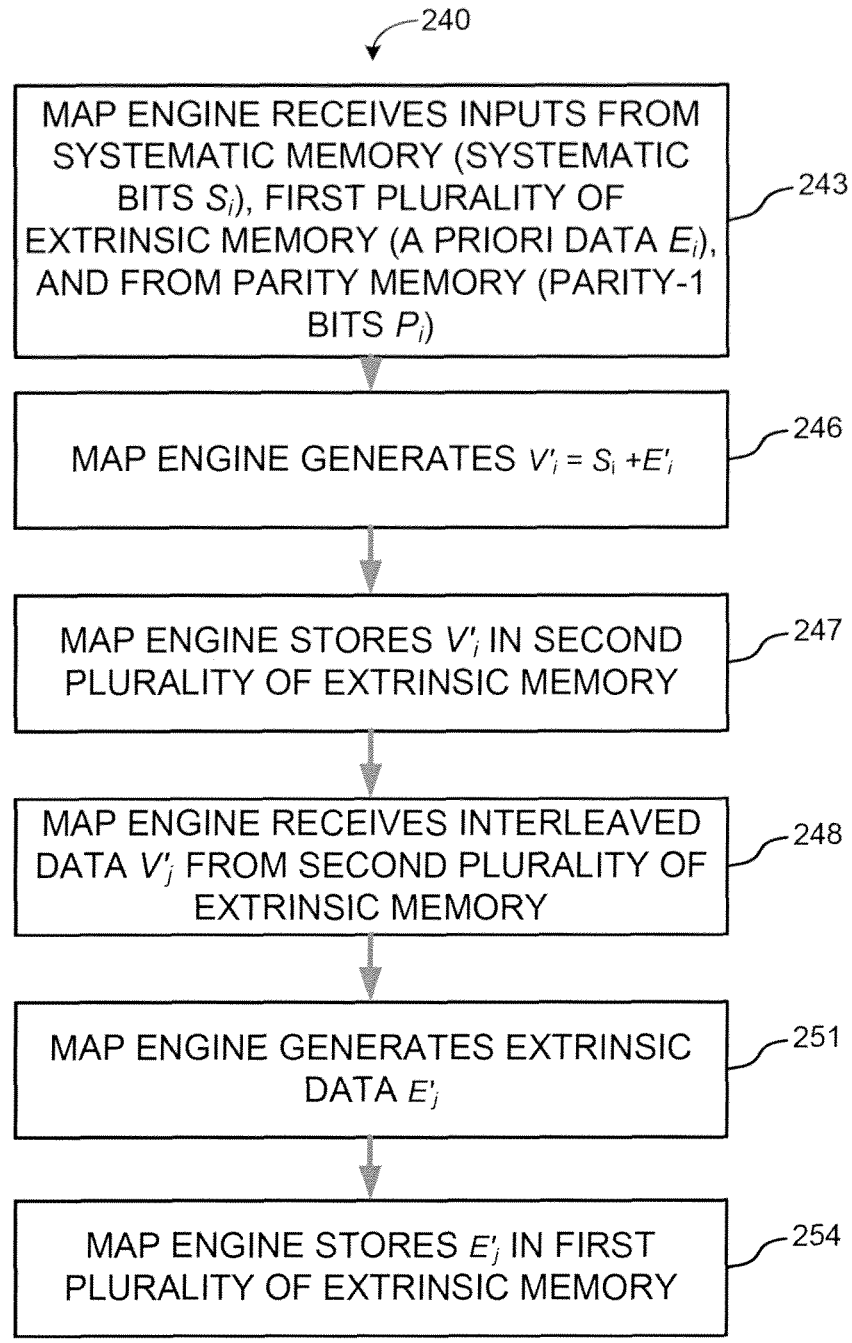
FIG. 3B is a flowchart illustrating an example method according to one embodiment of the present invention for avoiding systematic memory contention in a turbo decoder.

FIG. 3B is a flowchart illustrating an example method 240 in accordance with an embodiment for avoiding systematic memory contention in a turbo decoder, which may have multiple MAP engines. Method 240 begins with operations 243-247, which are performed during an even half-iteration of the decoding process. At operation 243, MAP engine receives as input systematic bits $s_i$ from a systematic memory bank of the systematic memory banks, a priori data $e_i$ from a first plurality of extrinsic memory banks, and parity-1 bits $p_i$ from a first parity memory bank of the plurality of parity memory banks. From these inputs, MAP engine generates $v'_i = s_i + e'_i$, which is subsequently stored in a second plurality of extrinsic memory banks.

Method 240 then continues with operations 248-254, which are performed during an odd half-iteration of the decoding process. At operation 248, MAP engine receives as input interleaved data $v_j$ from the second plurality of extrinsic memory banks, and parity-2 bits $p_j$ from a second parity memory bank of the plurality of parity memory banks. From the input, the MAP engine generates extrinsic data $e'_j$, which is subsequently stored in the first plurality of extrinsic memory banks for use during the next even half-iteration of the decoding process.

In embodiments where the turbo decoder comprises two or more MAP engines, method 240 may be performed with respect to each MAP engine within the decoder in order to avoid systematic memory contention between the multiple MAP engines.

In accordance with embodiments of the invention, extrinsic memory contentions can be avoided by partitioning extrinsic memory banks, and organizing data within the extrinsic memory banks of a turbo decoder in the same format an interleaver (or de-interleaver) table. Effectively, in some embodiments, data within the extrinsic memory banks is stored and retrieved in a manner consistent with the format of a interleaver or de-interleaver table.

FIG. 4 is a diagram illustrating an example of how data within the extrinsic memory banks is interleaved (or de-interleaved) when the data is organized and accessed in accordance with one embodiment of the present invention. Specifically, in some embodiments, when data within extrinsic memory banks is accessed (i.e., read from or written to extrinsic memory banks), it is interleaved according to the interleaving in FIG. 4. In additional embodiments, the interleaving (and, conversely, the de-interleaving) of data to and from the extrinsic memory is performed according to 3GPP Turbo interleaver specifications (e.g., WCDMA interleaver table). The 3GPP specification is a well known standard to those of ordinary skill in the art.

The interleaving (or de-interleaving) of FIG. 4 is performed as two operations. In the first operation 301, the data of table 300 is intra-row permuted such that table 303 results (in other words, the columns of table 300 are permuted). In the second operation 304, the data of table 303 is inter-row permuted such that table 306 results (in other words, the rows of table 303 are permuted). In some embodiments, the intra-row permutation operation and inter-row permutation operation are exchangeable. For example, in some embodiments, the intra-row permutation may be performed during an even half-iteration while the inter-row permutation may be performed during an odd half-iteration. Conversely, in some embodiments, the intra-row permutation may be performed during an odd half-iteration while the inter-row permutation may be performed during an even half-iteration.

FIGS. 5A and 5B illustrates methods for partitioning and accessing extrinsic memory banks according to one embodiment of the present invention. FIGS. 5A and 5B show two pluralities of extrinsic memory banks: a first plurality (309) and a second plurality (312), one from which extrinsic information input is red (e.g., 309) and one from which extrinsic information is output is stored (e.g., 312). As noted above, in some embodiments these two pluralities of extrinsic memory banks may be combined into one to save on cost and complexity. Some such embodiments utilize dual-port memory banks in order to accomplish this.

According to some embodiments, where a turbo decoder comprises N MAP engines, each plurality of extrinsic memory banks is partitioned into a N×N matrix. For example, for two MAP engines, each plurality of extrinsic memory banks is partitioned into 4 portions (i.e., 2×2 matrix), as illustrated in FIGS. 5A and 5B. The first plurality of extrinsic memory banks 309 comprises extrinsic memory banks E1, E2, E3, and E4, and the second plurality of extrinsic memory banks 312 comprises extrinsic memory banks Ea, Eb, Ec, and Ed. Depending on the embodiment, each extrinsic memory bank may be implemented as a single-port memory bank or a dual-port memory bank.

By partitioning each plurality of extrinsic memory banks into a N×N matrix, intra-row permutation can be performed when accessing the plurality of extrinsic memory banks during a first half-iteration, without the read and write operations ever crossing in to the horizontal boundary between extrinsic memory banks. Similarly, inter-row permutation can be performed when accessed the plurality of extrinsic memory banks during a second half-iteration, without the read and write operations ever crossing the vertical boundary between extrinsic memory banks. Effectively, this avoid extrinsic memory contentions between multiple MAP engines within the turbo decoder.

For example, FIG. 5A illustrates how the first (309) and second (312) pluralities of extrinsic memory banks are accessed during a first (e.g., even) half-iteration of the decoding process, while FIG. 5B illustrates how they are accessed during a second (e.g., odd) half-iteration of the decoding process. According to FIG. 5A, during a first half-iteration when intra-row permutation is performed, a first (e.g., upper) MAP engine reads from memory banks E1 and E2, and writes to memory banks Ea and Eb, while a second (e.g., lower) MAP engine reads from memory banks E3 and E4, writes to memory banks Ec and Ed. In some embodiments, memory banks E1 and E2 are considered the first row group of the first plurality of extrinsic memory banks, memory banks Ea and Eb are considered the first row group of the second plurality of extrinsic memory banks, memory banks E3 and E4 are considered the second row group of the first plurality of extrinsic memory banks, and memory banks Ec and Ed are considered the second row group of the second plurality of extrinsic memory banks.

According to FIG. 5B, during a second half-iteration when an inter-row permutation is performed, the first MAP engine reads from memory banks Ea and Ec, and writes to memory banks E1 and E3, while the a second MAP engine reads from memory banks Eb and Ed, and writes to memory banks E2 and E4. In some embodiments, memory banks Ea and Ec are considered the first column group of the second plurality of extrinsic memory banks, memory banks E1 and E3 are considered the first column group of the first plurality of extrinsic memory banks, memory banks Eb and Ed are considered the second column group of the second plurality of extrinsic memory banks, and memory banks E2 and E4 are considered the second column group of the first plurality of extrinsic memory banks.

The predetermined sequence in which data is read from and written to the pluralities of extrinsic memory banks may vary from embodiment to embodiment.

For example, as illustrated in FIG. 5A, during a first (e.g., even) half-iteration when the intra-row permutation is performed, the first (e.g., upper) MAP engine and the second (e.g., lower) MAP engine will read and write to their respective memory banks left to right (i.e., a form of column mode), starting with the top most row for their respective memory banks and working their way down. In FIG. 5B, during a second (e.g., odd) half-iteration when an inter-row permutation is performed, the first (e.g., upper) MAP engine and the second (e.g., lower) MAP engine will read and write to their respective memory banks up to down (i.e., a form of row mode), starting with the left most column for their respective memory banks and working their way down.

Figure 6A:
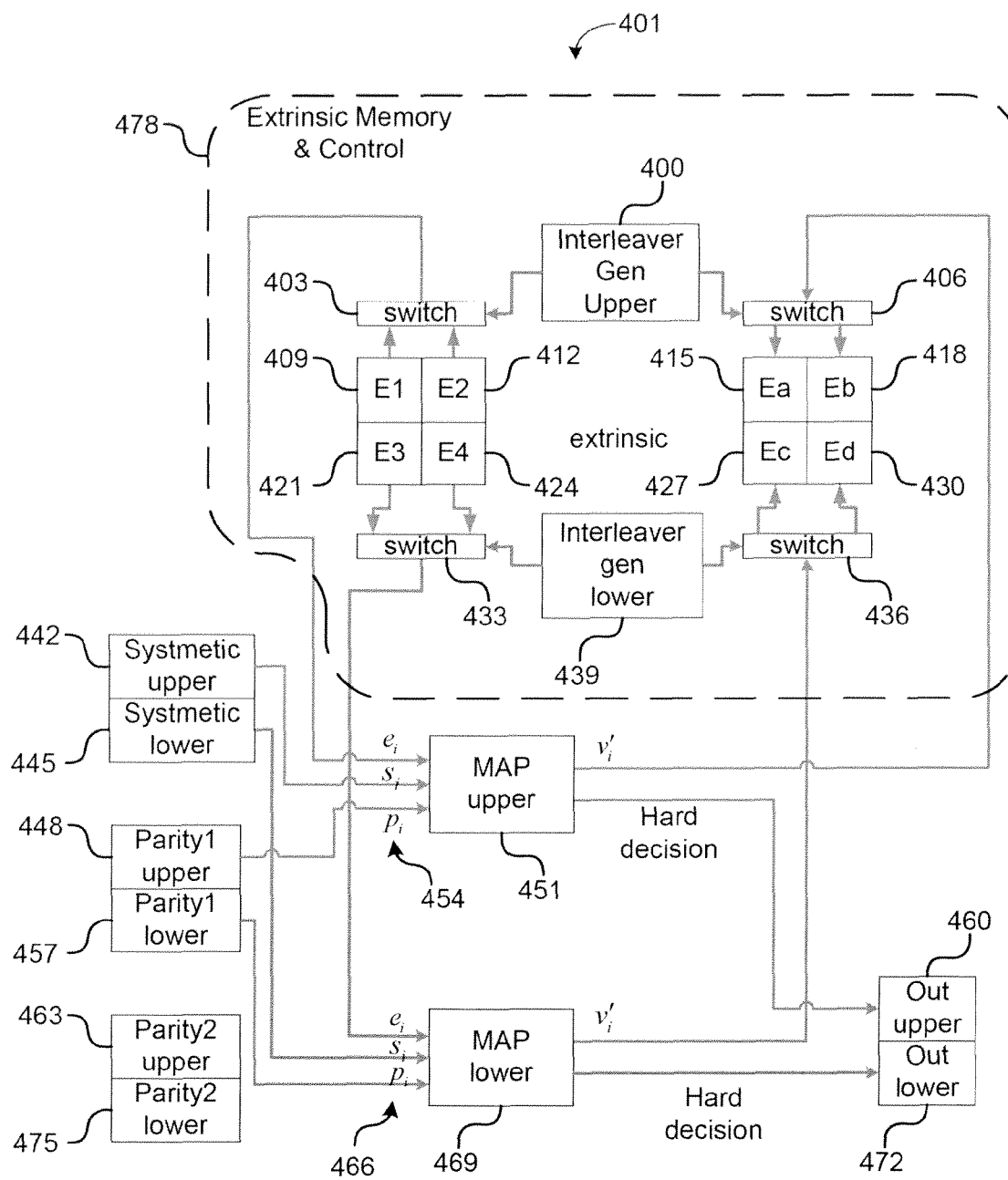
FIG. 6A is a diagram illustrating data flow during an even half-iteration operation for a turbo decoder according to one embodiment of the present invention.
Figure 6B:
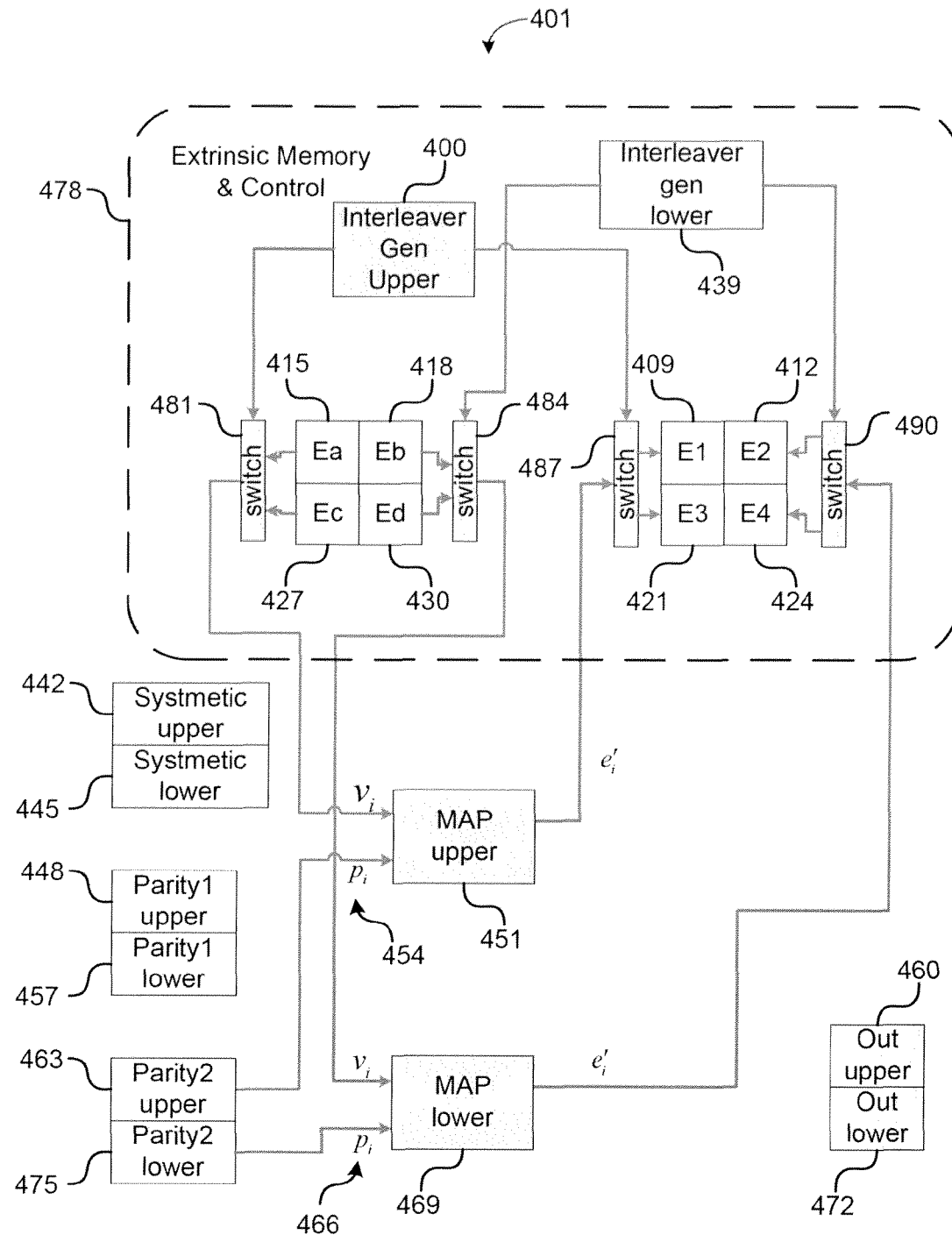
FIG. 6B is a diagram illustrating data flow during an odd half-iteration operation for a turbo decoder according to one embodiment of the present invention.

FIG. 6A is a diagram illustrating data flow during an even half-iteration operation for a turbo decoder 401 according to one embodiment of the present invention, and FIG. 6B is a diagram illustrating data flow during an odd half-iteration for the same turbo decoder 401.

Turning now to FIGS. 6A and 6B, the illustrated turbo decoder 401 comprises two MAP engines, a upper MAP engine 451 and a lower MAP engine 469, each of which has an extrinsic information input ($e_i$), a systematic information input ($s_i$), and a parity information input ($p_i$). In terms of inputs (454, 466), the MAP engines (451, 469) may receive systematic bits from upper and lower systematic memory banks (442, 445), parity-1 bits from upper and lower parity-1 memory banks (448, 457), parity-2 bits from upper and lower parity-2 memory banks (463, 475), extrinsic bits from extrinsic memory and control 478. With respect to outputs, the MAP engines (451, 469) may output their hard decision to upper and lower output memory banks (460, 472).

Similar to embodiments such as the one illustrated in FIG. 3A, the turbo decoder 401 avoids the need for interleaving systematic bits and, thus, can segment each memory bank for the systematic bits, parity-1 bits, and parity-2 bits into two segments for the two MAP engines. In other embodiments where the turbo decoder has more than two MAP engines, the memory banks for the systematic bits, parity-1 bits, and parity-2 bits would correspondingly be segmented the same number of times as there are MAP engines (e.g., 4 MAP engines, segment 4 times). The extrinsic memory 478 comprises a first plurality of extrinsic memory banks including extrinsic memory banks E1, E2, E3, and E4 (409, 412, 421, and 424), and a second plurality of extrinsic memory banks including extrinsic memory banks Ea, Eb, Ec, and Ed (415, 418, 427, and 430).

In some embodiments, an interleaver address generator enables the data within the extrinsic memory banks to be organized in a format similar to that of an interleaver table, enables the MAP generators to access data (i.e., read and write) within the extrinsic memory banks in accordance with that interleaver table format, and enables the extrinsic memory to function as a interleaver/de-interleaver for a turbo decoder. Additionally, in some embodiments, the interleaver address generators may be segmented into a separate address generator for each MAP engine. For example, in FIGS. 6A and 6B, upper interleaver address generator 400 controls reading from and writing to the extrinsic memory banks on behalf of the upper MAP engine 451, while lower interleaver address generator 439 controls reading from and writing to the extrinsic memory banks on behalf of the lower MAP engine 469. As illustrated, the interleaver address generators control access to the extrinsic memory banks through various switches (403, 406, 433, 436, 481, 484, 487, and 490).

According to some embodiments, during even half iterations, upper MAP engine 451 reads a-priori information from E1 and E2 and writes extrinsic information (added by systematic information) to Ea and Eb, while lower MAP engine 469 reads a-priori information from E3 and E4 and writes extrinsic information (added by systematic information) to Ec and Ed. During odd half iterations, upper MAP engine 451 reads a-priori information from Ea and Ec and writes extrinsic information to E1 and E3, while lower MAP engine 469 reads from Eb and Ed and writes to E2 and E4. As such, the extrinsic memory banks store the data in intra-row interleaved order and in inter-row natural order.

Turning now to FIG. 6A, illustrated is the data flow within turbo decoder 401 during an even half-iteration where intra-row permutation is being facilitated by the interleaver address generators (400, 439). For example, in some embodiments, the interleaver address generators control access to the extrinsic memory banks such that when the extrinsic memory banks are accessed (i.e., read from or written to), that data read or written will be in intra-row permuted (i.e., interleaved). The manner in which the interleaver address generators operate the extrinsic memory banks in order to interleave data may be in accordance with the 3GPP specification for Turbo interleavers. In order to generate $v'_i=s_i+e'_i$ during the even half-iteration, upper MAP engine 451 reads systematic bits ($s_i$) from upper systematic memory bank (442), parity-1 bits ($p_i$) from upper parity-1 memory bank (448), and extrinsic bits (e) from the first plurality of extrinsic memory banks (E1, E2, E3, E4), while lower MAP engine also reads systematic bits ($s_i$) from lower systematic memory bank (445), parity-1 bits ($p_i$) from lower parity-1 memory bank (457), and extrinsic bits ($e_i$) from the first plurality of extrinsic memory banks (E1, E2, E3, E4). Specifically, the upper MAP engine 451 reads extrinsic bits ($e_i$) from memory banks E1 (409) and E2 (412), and writes $v'_i=s_i+e'_i$ to memory banks Ea (415) and Eb (418), while the lower MAP engine 469 reads extrinsic bits ($e_i$) from memory banks E3 (421) and E4 (424), and writes $v'_i=s_i+e'_i$ to memory banks Ec (427) and Ed (430).

Turning now to FIG. 6B, illustrated is the data flow within turbo decoder 401 during an odd half-iteration where inter-row permutation is being facilitated by the interleaver address generators (400, 439). For example, in some embodiments, the interleaver address generators control access to the extrinsic memory banks such that when the extrinsic memory banks are accessed (i.e., read from or written to), that data read or written will be in inter-row permuted (i.e., interleaved). As previously noted, the manner in which the interleaver address generators operate the extrinsic memory banks in order to interleave data may be in accordance with the 3GPP specification for Turbo interleavers. In order to generate extrinsic bits ($e'_i$) during the odd half-iteration, upper MAP engine 451 reads $v_i=s_i+e_i$ from the second plurality of extrinsic memory banks, and parity-2 bits ($p_i$) from upper parity-2 memory bank (463), while lower MAP engine 469 reads $v_i=s_i+e_i$ from the second plurality of extrinsic memory banks, and parity-2 bits ($p_i$) from lower parity-2 memory bank (475). Specifically, the upper MAP engine 451 reads $v_i=s_i+e_i$ from memory banks Ea (415) and Ec (427), and writes extrinsic bits ($e'_1$) to memory banks E1 (409) and E3 (421), while the lower MAP engine 469 reads $v_i=s_i+e_i$ from memory banks Eb (418) and Ed (430), and writes extrinsic bits ($e'_i$) to memory banks E2 (412) and E4 (424).

As illustrated, input memory banks comprise two systematic memory banks (upper and lower systematic memory bank—SU and SL), two parity-1 memories (upper and lower parity-1 memory bank—P1U and P1L) and two parity-2 memories (upper and lower parity-2 memory bank—P2U and P2L). In even half iterations (FIG. 6A), the SU and P1U memory banks are read by upper MAP engine 451, and SL and P1L memory banks are read by lower MAP engine 469. In odd half iterations (FIG. 6B), P2U memory bank is read by upper MAP engine 451, and P2L is read by lower MAP engine 469.

In some embodiments, the physical size of each input memory bank (SU, SL, P1U, P1 L, P2U, and P2L) is 2560 words. Additionally, in some embodiments, the SU and P1U memory banks hold first nP1U=⌈R/2⌉*C input soft bits, and the SL and P1L memory banks hold the remaining nP1L=K−⌈R/2⌉*C input soft bits, where K is the code block size, and R and C are the numbers of row and column of interleave permutation matrix respectively (i.e., interleaver table). In additional embodiments, the P2U memory bank holds the first nP2U input soft bits and the P2L memory banks holds the remaining nP2L=K−nP2U input soft bits.

With respect to input memory control, in some embodiments, the input memory controller is responsible for distributing input data to the proper memory banks. For example, in some embodiments, distributes input soft bit sequences as follows: $x_1, z_1, z'_1, x_2, z_2, z'_2, \ldots, x_K, z_K, z'_K, x_{K+1}, z_{K+1}, x_{K+2}, z_{K+2}, x_{K+3}, z_{K+3}, x'_{K+1}, z'_{K+1}, x'_{K+2}, z'_{K+2}, x'_{K+3}, z'_{K+3}$, where $x_1, x_2, \ldots, x_K$ are the systematic bits, $z_1, z_2, \ldots, z_K$ and $z'_1, z'_2, \ldots, z'_K$ are the parity bits, K is code block size, and the last 12 bits are tail bits.

In order to distribute data to the proper memory banks, in some embodiments, there are two pre-set addresses (Addr1 and Addr2) for each data input data type (systematic, parity 1 or parity 2). Then, for each data type: if the bit offset is less than the Addr1, the bit is written to upper memories (i.e., SU, P1U and P2U); if the bit offset is greater than or equal to Addr1 but less than Addr2, the bit is written into lower memories (i.e., SL, P1L and P2L); and if the bit offset is greater than or equal to Addr2, the bit is written to the registers for tail bits. In some embodiments, for systematic and party 1 bits, Addr1=nP1U and Addr2=nP1L; for parity 2 bits, Addr1=nP2U and Addr2=nP2L.

Figure 6C:
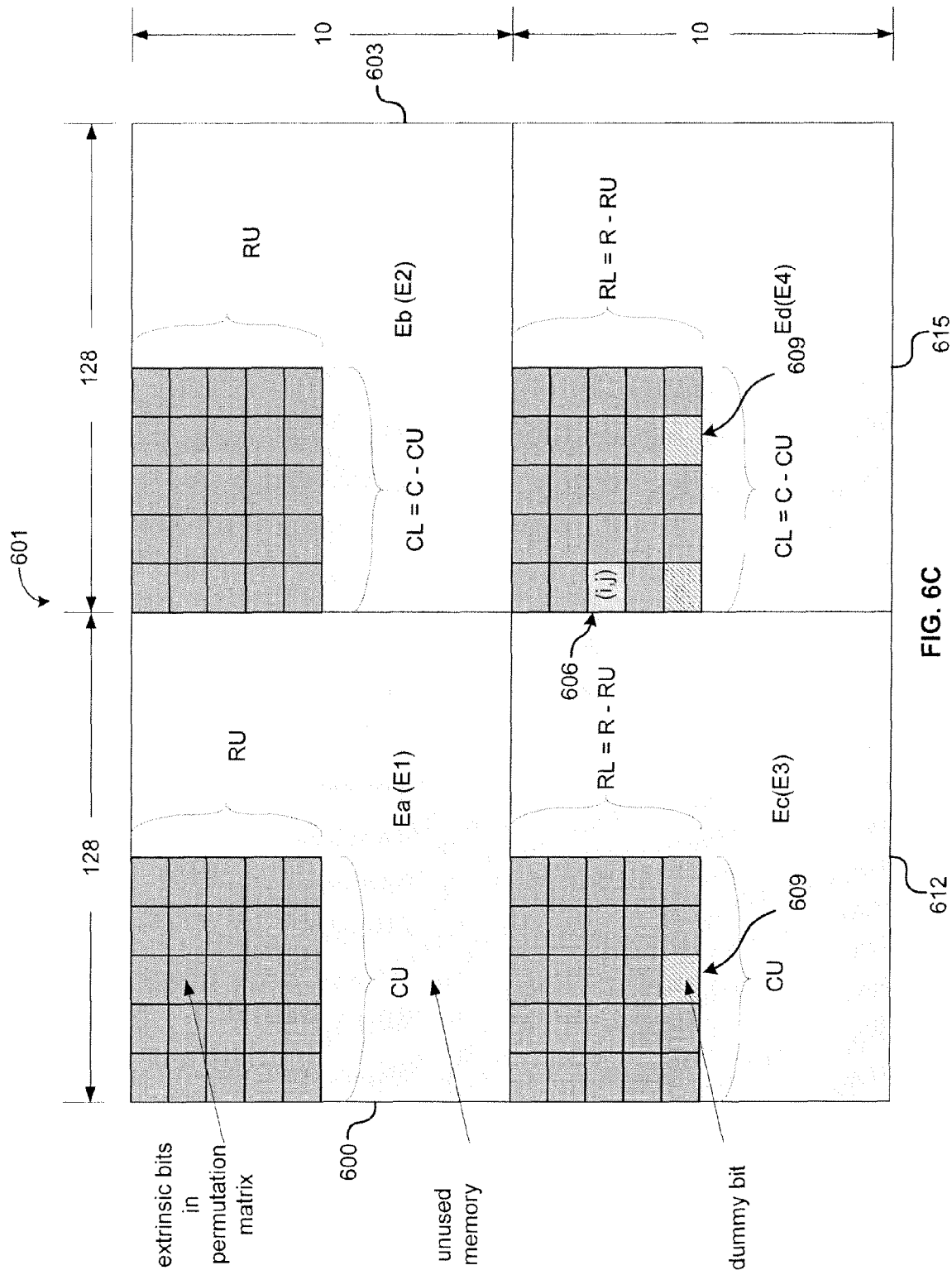
FIG. 6C is a diagram illustrating an interleave matrix in extrinsic memory banks in accordance with one embodiment of the present invention.

In some embodiments, nP1U and nP1L may be computed as follows: nP1U=⌈R/2⌉*C and nP1L=K−nP1U. In other embodiments, nP2U and nP2L are computed as follows:

1. Compute the total dummy bits:     nDummyBits = R*C-K
2. Compute the number of rows with dummy bits:     nDummyRows = ⌈nDummyBits/C⌉
3. Compute the number of columns in the left side:     ⌈CU = C/2⌉
4. Compute the number of dummy bits in the last row with non-dummy bits
        nDummyBitsLastRow = nDummyBits mod C
5. nDummyLeft = 0 //local variable
    If nDummyBitsLastRow ! = 0
       if C == p-1
           For i = 0 to CU-1 //for bits in the left half side
             if s(i*r(R-nDummyRow)%(p-1))-1 <
C - nDummyBitsLastRow
               nDummyLeft++;
           end if
         end for
      else     //for C != p-1
        For i = 0 to CU-1    //for bits in the left half side
           if s(i*r(R-nDummyRows)%(p-1) )<
C - nDummyBitsLastRow
            nDummyLeft++;
         end if
      end for
        End if //C == p-1
6. nP2U = CU * (R - nDummyRows) + nDummyLeft
7. nP2L = K - nP2U As previously noted, each of input memory can be implemented using single-port memory banks. For example, for a two MAP engine turbo decoder, if single-port memory banks are used for the extrinsic memory banks, eight memory banks would be needed, and if dual-port memory banks are used for the extrinsic memory banks, four extrinsic memory banks would be needed. For example, if dual-port memory banks are utilized, memory banks E1 and Ea would be the same, memory banks E2 would be the same, memory banks E3 and Ec would be the same, and memory banks E4 and Ed would be the same. This is illustrated in FIG. 6C, which is a diagram illustrating an interleave matrix 601 in extrinsic memory banks in accordance with one embodiment of the present invention.

According to the 3GPP specification, a interleaver permutation matrix has R*C elements, while the input data have K bits. In FIG. 6C, interleave matrix 601, has R=20 and C=256, in accordance with the 3GPP specification. In some embodiments, when R*C>K, the rest of the matrix are occupied by dummy bits, which will be pruned during memory access and interleave processing. In some embodiments, the positions of those dummy bits are only located in extrinsic memory banks Ec and Ed, and are marked as dummy bits during the first odd half-iteration of a decoding process. In order to avoid extra memory storage for dummy bits, the dummy bits may be marked as the most negative value, while the normal output data from MAP engines store a two's complement and range symmetrically.

In the interleaver permutation matrix 601, all the dummy bits are located in the last nDummyRow rows, where nDummyRow. For some embodiments, in order to simplify the design of interleave address generators, the dummy bits are marked in memories Ec and Ed while the input soft bits are written into systematic and parities memory.

In some embodiments, entire rows (C elements) are first marked as most negative value. Then, at the first even half iteration, the output of the MAP engines will overwrite some of negative values, while the rest remain as dummy bits. Subsequently, in each odd half iteration, when the dummy bits are read out from Ec and Ed memories, dummy bit detection is used to detect dummy bits by comparing the value with the most negative value. If the value is the same as the most negative value, a data invalid signal will be sent to Upper MAP engine or lower MAP engine to hold the respective MAP engine for a cycle. Depending on the embodiment, multiple MAP engines may be held simultaneously.

In some embodiments, the physical size of each extrinsic memory bank is 1280 words. In some embodiments, memory banks E1 and Ea each stores RU*CU=$\lceil R/2 \rceil * \lceil C/2 \rceil$ extrinsic soft bits, memory banks E2 and Eb each stores RU*CL=$\lceil R/2 \rceil * \lfloor C/2 \rfloor$ soft bits, memory banks E3 and Ec each stores nP2U-$\lceil R/2 \rceil * \lceil C/2 \rceil$ soft bits, and memory banks E3 and Ed each stores nP2U-$\lceil R/2 \rceil * \lfloor C/2 \rfloor$ soft bits. Memory $\lceil$ banks Ec and Ed also stores dummy bits (e.g., 609).

In some embodiments, in order to simplify the physical address calculation by the interleaver address generators (400, 439) in extrinsic memory banks, the extrinsic data stored in the extrinsic memory banks are not in continuous addresses. Each row may occupy 128 words regardless of the size of row. Given the element index (i,j) in sub-matrix in memory Ed, shown in the figure below, the physical address is computed as: i*128+j, where i=0 to RL-1,j=0 to CL-1.

Figure 6D:
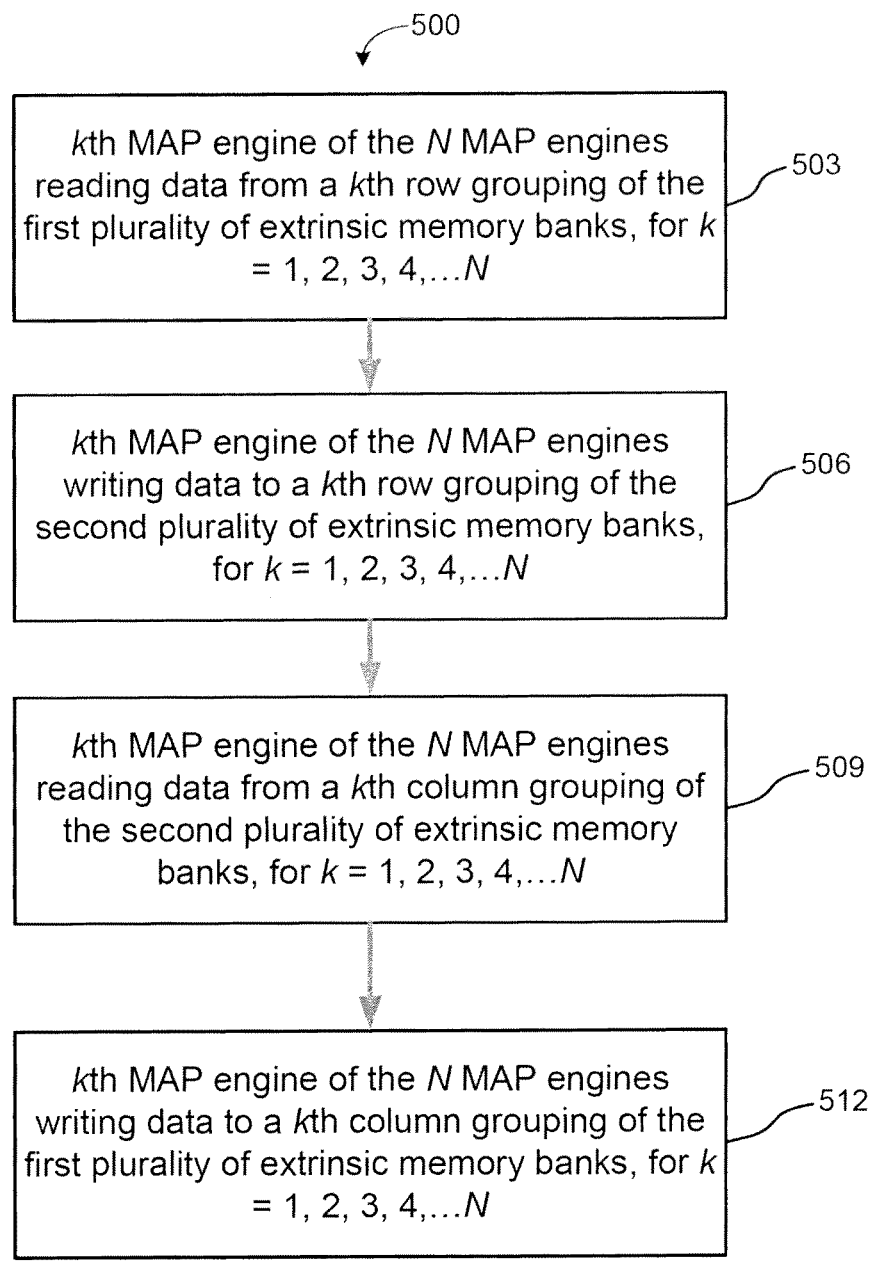
FIG. 6D is a flowchart illustrating an example method according to one embodiment of the present invention for avoiding extrinsic memory contention in a turbo decoder.

FIG. 6D is a flowchart illustrating an example method 500 for avoiding extrinsic memory contention in a turbo decoder. Method 500 is performed by a turbo decoder comprising N MAP engines, where each kth MAP engine of the N MAP engines, for k=1, 2, 3, 4, . . . N, performs the operations illustrated (503, 506, 509, and 512). According to some embodiments, operations 503 and 508 are to be performed during a first (e.g., even) half-iteration of the decoding process when intra-row permutation is being performed, and operations 509 and 512 are to be performed during a second (e.g., odd) half-iteration when inter-row permutation is being performed.

In operation 503, each kth MAP engine within the turbo decoder reads data from a corresponding kth row grouping of the first plurality of extrinsic memory banks. In operations 506, each kth MAP engine within the turbo decoder writes data to a corresponding kth row grouping of the second plurality of extrinsic memory banks.

In operation 509, each kth MAP engine within the turbo decoder reads data from a corresponding kth column grouping of the second plurality of extrinsic memory banks. In operations 512, each kth MAP engine within the turbo decoder writes data to a corresponding kth column grouping of the first plurality of extrinsic memory banks. In some embodiments, by performing the operations of method 500 for a turbo decoder having N MAP engines, the data access of the extrinsic memory banks effectively interleave and de-interleave the data for the turbo decoder, while avoiding extrinsic memory contentions amongst two or more MAP engines.

Figure 7A:
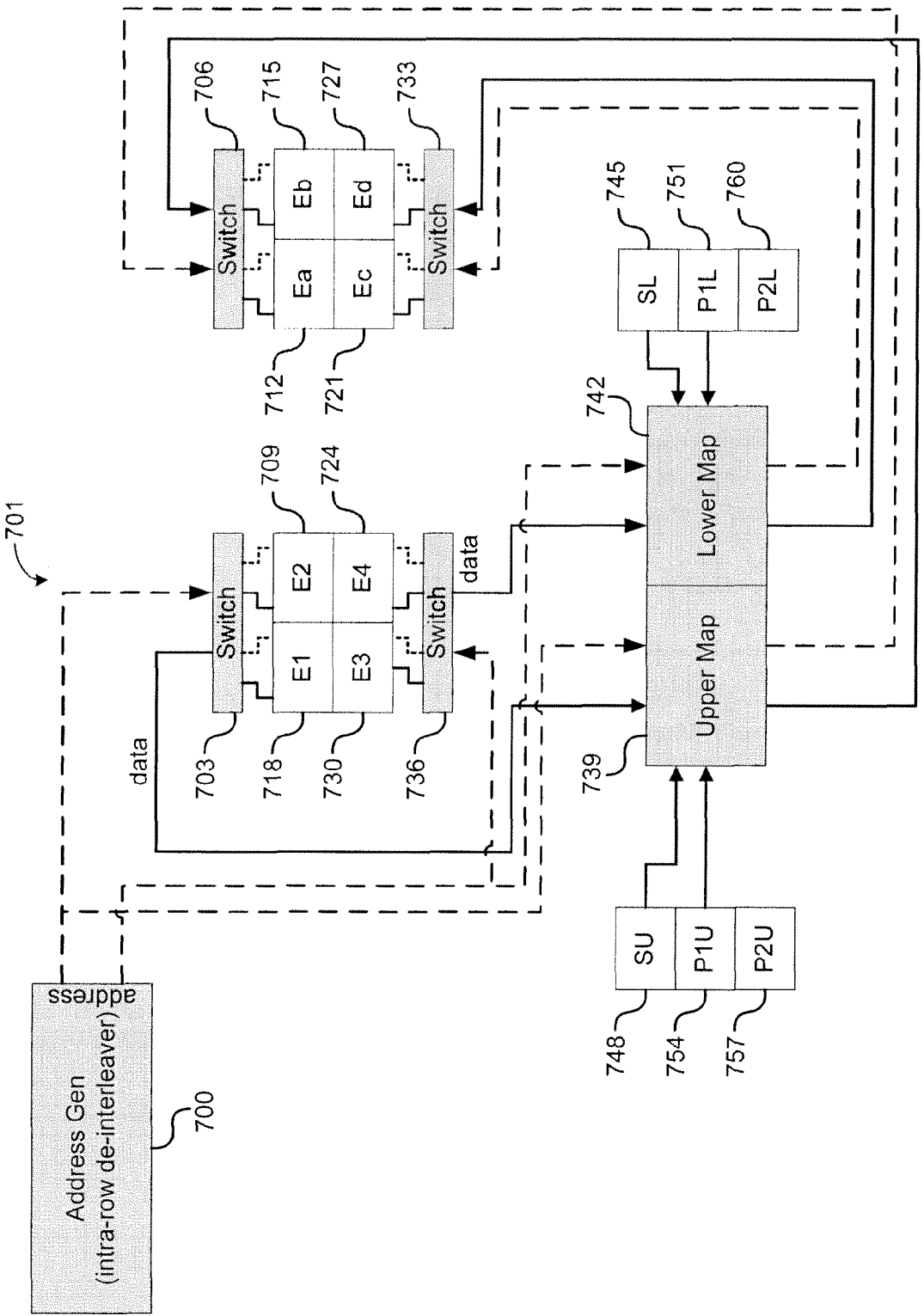
FIG. 7A is a diagram illustrating data and address flow in an even half-iteration operation for a turbo decoder according to one embodiment of the present invention.
Figure 7B:
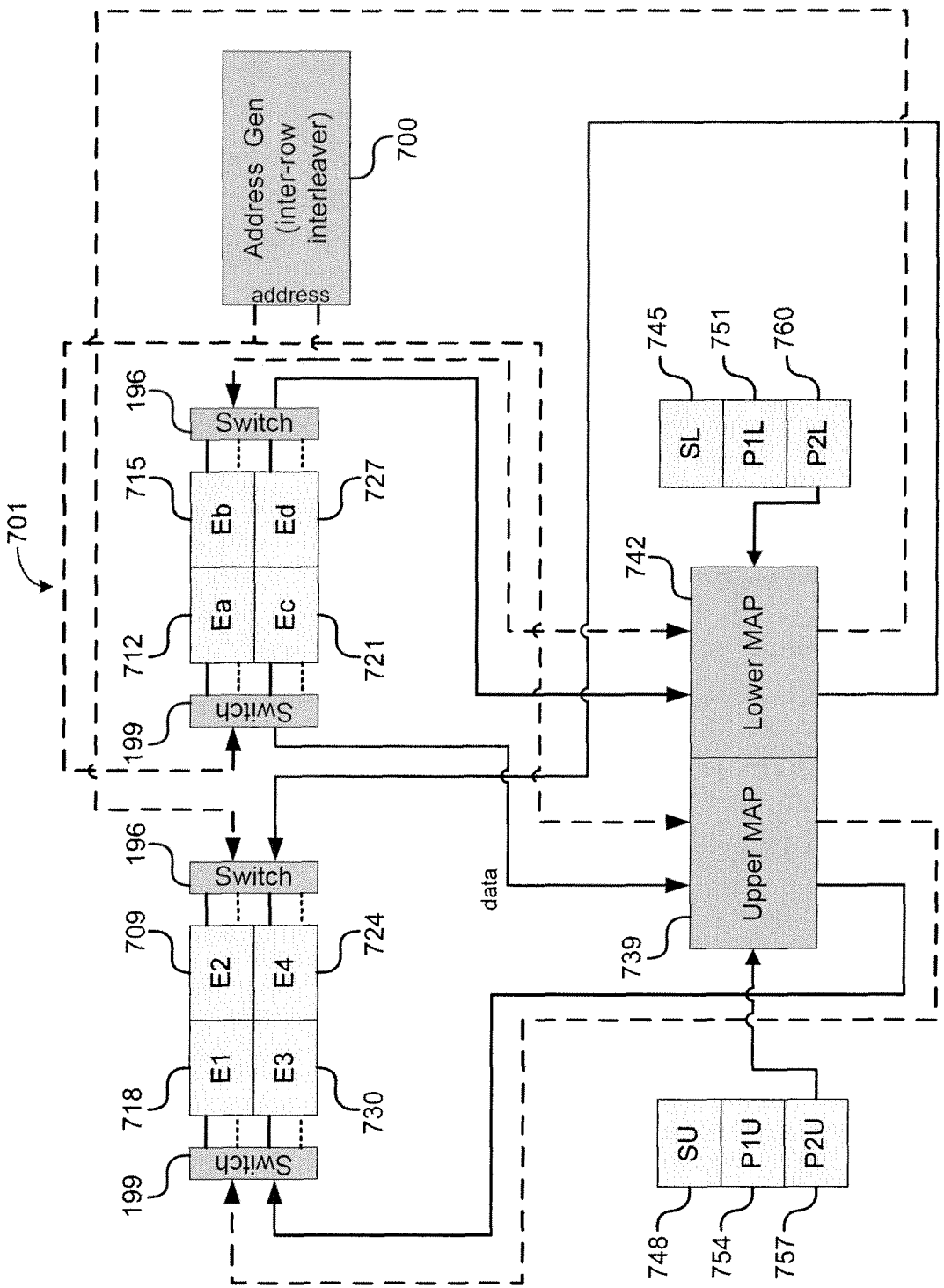
FIG. 7B is a diagram illustrating data and address flow in an odd half-iteration operation for a turbo decoder according to one embodiment of the present invention.

FIG. 7A is a diagram illustrating data and address flow in an even half-iteration operation for a turbo decoder 701 according to one embodiment of the present invention, and FIG. 7B is a diagram illustrating data and address flow in an odd half-iteration operation for the same turbo decoder 701.

Turning now to FIG. 7A, during even half iterations, upper MAP engine 739 reads a-priori information from E1 (718) and E2 (709) (except for the first half iteration, when no a-priori information is available) and writes extrinsic information to Ea (712) and Eb (715), while lower MAP engine 742 reads a-priori information from E3 (730) and E4 (724) (except for the first half iteration, when no a-priori information is available) and writes extrinsic information to Ec (721) and Ed (727). As such, the extrinsic memory banks store the data in intra-row interleaved order and in inter-row natural order. In some embodiments, when the data read is a-priori information or when the data written is extrinsic information, the interleave address generator 700 produces a de-interleave address for each row in natural row by row order (thereby resulting in intra-row permutation of the data).

In embodiments where there are two MAP engines working simultaneously (e.g., a upper MAP engine 739 and a lower MAP engine 742), during the even half-iteration, the interleave address generator produces two addresses per cycle for the two MAP engines. Since the location of the data read from is the same as the location that the data written to (but may be to a different memory bank where there are, for example, two pluralities of extrinsic memory banks), delayed de-interleave addresses can be used in an extrinsic write operations after it has been used for an a-priori read operation. FIG. 8A demonstrates the data (solid line) and address (dashed line) flow associated with such an operation during an even half-iterations of the decoding process. The read data is sent to MAP engines associated with the address and then, after certain delay (e.g., same as the delay of turbo decode processing) the same de-interleave address is used for an extrinsic write operation. In some embodiments, the data input to MAP engine is in natural order while the output from MAP engine is in reversed order within a decode window; as such, the read address for k-th input bit will be used as the write address for k-th output bit.

It should be noted, that in some embodiments there is no a-priori information available from previous half iteration. Accordingly, the a-priori information sent to the MAP engines is all zeros, even though the interleave address generator 700 still produces address and sends them to MAP engines with the a-priori bits; this address can still be used during the subsequent extrinsic write operation.

Turning now to FIG. 7B, in odd half iterations, upper MAP engine 739 reads a-priori information from Ea (712) and Ec (721) and writes extrinsic information to E1 (718) and E3 (730), while lower MAP engine reads from Eb (715) and Ed (727) and writes to E2 (709) and E4 (724). When the data is read from and written to the extrinsic memory banks, the interleave address generator 700 produces natural addresses for each row but interleaved address row by row (thereby resulting in inter-row permutation of the data).

In embodiments where there are two MAP engines working simultaneously (e.g., a upper MAP engine 739 and a lower MAP engine 742), during the odd half-iteration, the interleave address generator produces two addresses per cycle for the two MAP engines. Since the location of the data read from is the same as the location that the data written to (but may be to a different memory banks where there are, for example, two pluralities of extrinsic memory banks), delayed interleave addresses can be used in an extrinsic write operations after it has been used for an a-priori read operation.

According to some embodiments, the interleaving performed by is in accordance with the following the 3GPP specification. The following notations are useful in understanding how the 3GPP specification:

| | |
|---|---|
| K | Number of bits input to Turbo code internal interleaver |
| R | Number of rows of rectangular matrix |
| C | Number of columns of rectangular matrix |
| P | Prime number |
| v | Primitive root |
| $(s(j))_{j\in\{0,1,...,p-2\}}$ | Base sequence for intra-row permutation |
| $q_i$ | Minimum prime integers |
| $r_i$ | Permuted prime integers |
| $(T(j))_{j\in\{0,1,...,R-1\}}$ | Inter-row permutation pattern |
| $(U_i(j))_{j\in\{0,1,...,R-1\}}$ | Intra-row permutation pattern of i-th row |
| i | Index of row number of rectangular matrix |
| j | Index of column number of rectangular matrix |
| k | Index of bit sequence |

The $s^{-1}(j)$ sequence is the inversed permutation sequence of sequence $s(j)$ (i.e, $s^{-1}$) and used to perform the reversed permutation of intra-row interleave:

$$s^{-1}(s(j))=j, j=0, \ldots, p-2 \qquad \text{Equation 1}$$

The $r^{-1}(i)$ sequence is defined such that each element is the reciprocal of the corresponding element of r sequence in terms of modulus of p−1:

$$r_i^{-1} * r_i \equiv 1 \pmod{p-1} \, i=0, \ldots R-1 \qquad \text{Equation 2}$$

The $U_i^{-1}(j)$ sequence is defined as intra-row reversed permutation pattern of i-th row, i.e:

$$U_i^{-1}(U_i(j))=j \qquad \text{Equation 3}$$

The computation of $s^{-1}(j)$ sequence may be performed offline. The 3GPP describes this computation of s as:

$$s(j)=(v*s(j-1)) \bmod p \, j=1,2,\ldots,(p-2), \text{and } s(0)=1 \qquad \text{Equation 4}$$

According to this definition, $s^{-1}(j)$ is constructed as:
$s^{-1}(1)=0$
$s(0)=1$
for j=1 to p−2
  compute s(j)
  $s^{-1}(s(j))=j$;
end for The computation of $r^{-1}(i)$ sequence may be performed offline as well. The 3GPP describes this computation of s as:

$$r_{T(i)}=q_i, i=0,1,\ldots,R-1, \qquad \text{Equation 5}$$

In order to simplify the computation of $r^{-1}(i)$ sequence, in some embodiments, $q^{-1}(i)$ for i=1,...,R−1 is first computed, since $q^{-1}(0)$ is always 1 and doesn't need computation. Then sequence $r^{-1}(i)$ is obtained as:

$$r^{-1}_{T(i)}=q^{-1}_i, i=0,1,\ldots,R-1, \qquad \text{Equation 6}$$

In order to compute $q^{-1}$ sequence, extended Euclidean algorithm may be used. The following is a modified algorithm for each $q^{-1}(i)$:

```
a = p - 1;
b = q[i];
c = 0;
d = 1;
while(b! = 1){
    if (a>b){
        a = a-b;
        c = c-d;
    } else {
        b = b-a;
        d = d-c:
    }
}
q^-1 [i] = d;
```

In view of above, in some embodiments that utilize the 3GPP specification for de-interleaving, the de-interleave address may be calculated as follows:

$$U_i^{-1}(U_i(j)) = j, \qquad \text{Equation 7}$$

if(C==p). According to 3GPP, $U_i(j)$ is computed as $$U_i(j)=s((j*r_i)\bmod(p-1)), j=0,1,\ldots,(p-2), \text{and } U_i(p-1)=0, \qquad \text{Equation 8}$$

then $$s^{-1}(U_i(j)) = s^{-1}s((j*r_i)\bmod(p-1)) \qquad \text{Equation 9}$$
$$s^{-1}(U_i(j)) = (j*r_i)\bmod(p-1)$$
$$(s^{-1}(U_i(j))*r_i^{-1})\bmod(p-1) = (j*r_i*r_i^{-1})\bmod(p-1)$$
$$(s^{-1}(U_i(j))*r_i^{-1})\bmod(p-1) = j$$

Compare Equation C with equation A, we get $$U_i^{-1}(j)=(s^{-1}(U_i(j))*r_i^{-1})\bmod(p-1) \qquad \text{Equation 10}$$

Similarly, $U_i^{-1}(j)$ sequence can be obtained when (C=p+1) or (C=p−1). $U_i^{-1}(j)$ is computed on the fly while $s^{-1}$ And $r^{-1}$ are pre-computed. From the equation above, to generate a intra-row de-interleave address, it takes one operation of memory read (i.e. $s^{-1}(.)$), one multiplication operation (i.e. $s^{-1}(.)*r_i^{-1}$) and one division operation (i.e. mod(p−1)).

In some embodiments, the following pseudo code may be used to compute de-interleaved intra-row address:
Variables:
cInd_, Column index, range from 0 to C−1
rind_, Row index, range from 0 to R−1
s__1(j), the inversed permutation sequence of sequence s(j), j from 0 to p−2
r__1(j), the sequence of $r^{-1}$, which is the reciprocal of r in terms of modulus of p−1,j from 0 to R−1
Output:
cAdd, the intra-row de-interleave address
Pseudo code:
1. In case of C==p
  If cInd_==0
  cAdd=p−1;
  else
  cAdd=(s__1[cInd_−1])*r__1[rInd_]%/(p−1);
  end if
2. In case of C==p+1
  if cInd==0
  cAdd=p−1;
  else if cInd_==p
  cAdd1=p;

```
else
   cAdd=(s_1[cInd_-1])*r_1[rInd_]%(p-1);
end if
if(K==R*C)&& (rInd_+RU_==R-1) // special case
   if cAdd==0
      cAdd=p;
   else if cAdd==p
      cAdd=0;
   end if
end if // end of special case
3. In case of C==p-1
   cAdd=(s_1[cInd_])*r_1[rInd_]%(p-1);
```

In alternative embodiments, in order to generate a de-interleave address for even half-iterations, the multiplication and a division operations typically needed per cycle per MAP engine can be avoided by first generating a row of intra-row interleave addresses, and then building an intra-row de-interleave address based on the interleave address. In such embodiments, the building of an intra-row de-interleave addresses based on the interleave addresses needs only addition and subtraction operations only. Some such embodiments utilize two 256-word buffers per MAP engine.

Figure 8:
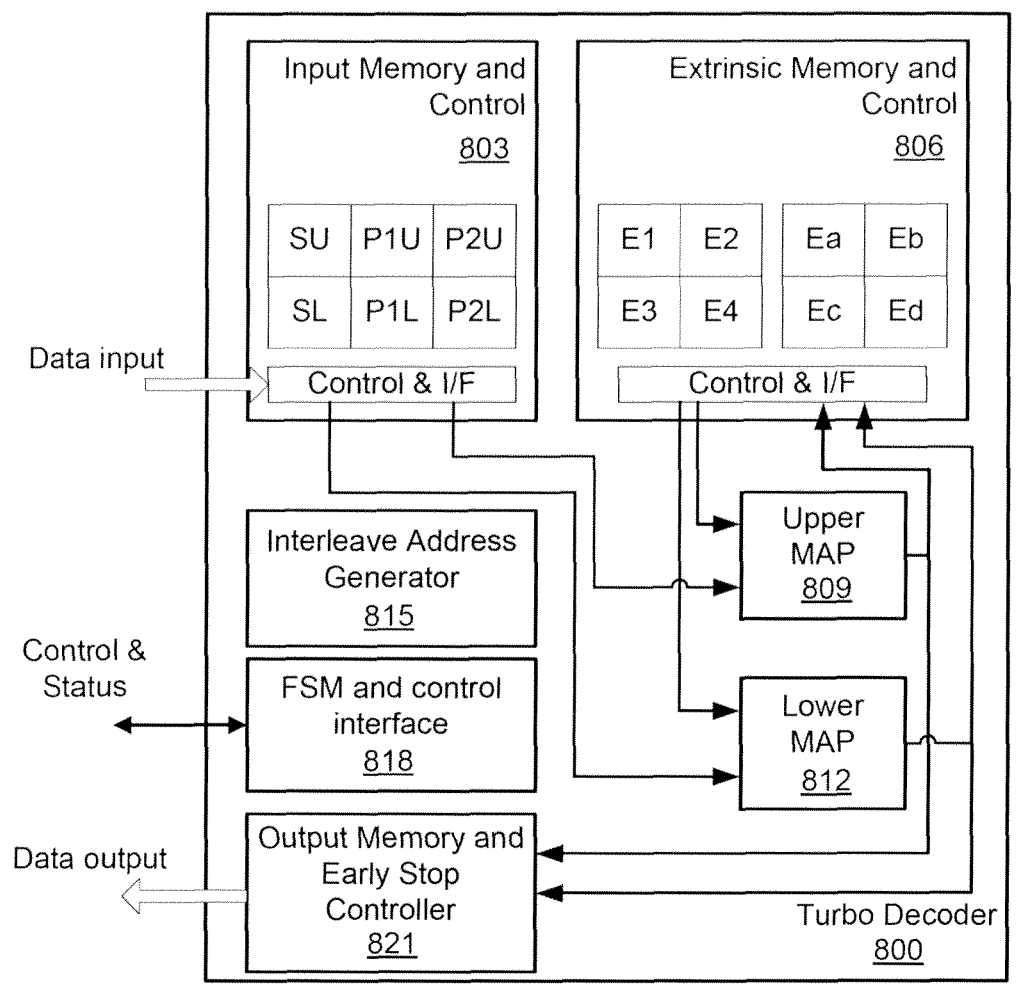
FIG. 8 is a diagram illustrating a top-level perspective of an example turbo decoder in accordance with one embodiment of the present invention.

According to some embodiments that utilize the 3GPP specification for interleaving, the inter-row interleave address is given by the 3GPP specification as the pattern $\langle T \rangle_{i \in \{0,1,\ldots,R-1\}}$, where T(i) is the original row position of the i-th permuted row. $\langle$ FIG. 8 is a diagram illustrating a top-level perspective of an example turbo decoder 800 in accordance with one embodiment of the present invention.

As illustrated, the turbo decoder comprises an input memory and control 803, an extrinsic memory and control 806, an upper MAP engine 809, a lower MAP engine 812, an interleave address generator 815, a finite state machine (FSM) and control interface 818, and an output memory and early stop controller 821.

In accordance with various embodiments, the input memory and control 803 comprises a control and access interface for the unit 803, and systematic memory banks, parity-1 memory banks, and parity-2 memory banks divided into two segments for the two MAP engines (809 and 812). In accordance with other embodiments, the extrinsic memory and control 806 comprises a control and access interface for the unit 806, and two plurality of extrinsic memory banks (E1, E2, E3, and E4, and Ea, Eb, Ec, and Ed), each partitioned into a 2×2 matrix for the two MAP engines (809 and 812).

In some embodiments, the interleave address generator 815 facilitates operation and control of the extrinsic memory 806 in accordance embodiments described herein. The FSM and control interface 818 may serves to control the overall turbo decoder. Data output from the turbo decoder may be stored and controlled by an output memory and early stop controller 821.

As used herein, the term set may refer to any collection of elements, whether finite or infinite. The term subset may refer to any collection of elements, wherein the elements are taken from a parent set; a subset may be the entire parent set. The term proper subset refers to a subset containing fewer elements than the parent set. The term sequence may refer to an ordered set or subset. The terms less than, less than or equal to, greater than, and greater than or equal to, may be used herein to describe the relations between various objects or members of ordered sets or sequences; these terms will be understood to refer to any appropriate ordering relation applicable to the objects being ordered.

Figure 9:
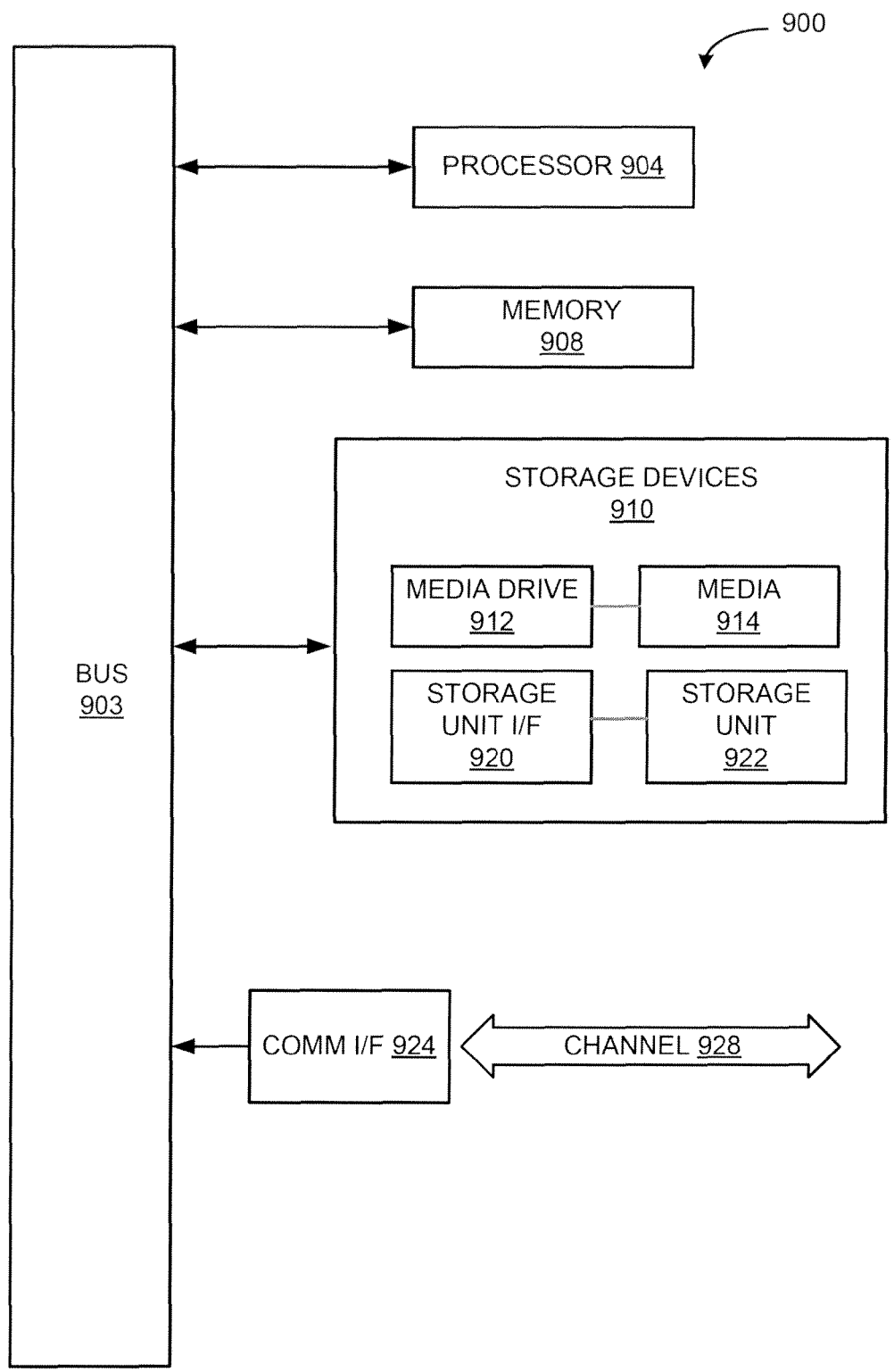
FIG. 9 is a diagram illustrating an example computing module with which aspects of the systems and methods described herein can be implemented in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 9. Various embodiments are described in terms of this example-computing module 900. After reading this description, it will become apparent to a person skilled in the relevant art how to implement the invention using other computing modules or architectures.

Referring now to FIG. 9, computing module 900 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 900 might include, for example, one or more processors, controllers, control modules, or other processing devices, such as a processor 904. Processor 904 might be implemented using a general-purpose or special-purpose processing engine such as, for example, a microprocessor, controller, or other control logic. In the illustrated example, processor 904 is connected to a bus 902, although any communication medium can be used to facilitate interaction with other components of computing module 900 or to communicate externally.

Computing module 900 might also include one or more memory modules, simply referred to herein as main memory 908. For example, preferably random access memory (RAM) or other dynamic memory, might be used for storing information and instructions to be executed by processor 904. Main memory 908 might also be used for storing temporary variables or other intermediate information during execution of instructions to be executed by processor 904. Computing module 900 might likewise include a read only memory ("ROM") or other static storage device coupled to bus 902 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive might be provided. Accordingly, storage media 914 might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory module) and memory slot, a PCMCIA slot and card, and other fixed or removable storage units 922 and interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 924 might typically be carried on signals, which can be electronic, electromagnetic (which includes optical) or other signals capable of being exchanged by a given communications interface 924. These signals might be provided to communications interface 924 via a channel 928. This channel 928 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 920, media 914, and channel 928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A turbo decoder comprising:
a plurality of maximum a posteriori (MAP) engines:
a first plurality of extrinsic memory banks and a second plurality of extrinsic memory banks; and
wherein each of the first and second pluralities of extrinsic memory banks is accessible by at least one of the plurality of MAP engines, wherein the plurality of MAP engines comprises N MAP engines, and where the turbo decoder is configured such that during decoding:
in a first half of a decoding iteration, the N MAP engines read data from the first plurality of extrinsic memory banks by row according to a first predetermined sequence, and write data to the second plurality of extrinsic memory banks by row according to the first predetermined sequence; and
in a second half of the decoding iteration, the N MAP engines read data from the second plurality of extrinsic memory banks by column according to a second predetermined sequence, and write data to the first plurality of extrinsic memory banks by column according to the second predetermined sequence.

2. The turbo decoder of claim 1, wherein during decoding, the first and second pluralities of extrinsic memory banks are accessed for data by the at least the one of the plurality of MAP engines such that the first and second pluralities of extrinsic memory banks function as an interleaver or a de-interleaver of extrinsic information within the turbo decoder.

3. The turbo decoder of claim 1, wherein the interleaver table is formatted in accordance with a 3rd Generation Partnership Project (3GPP) standard.

4. The turbo decoder of claim 1, wherein the first half of the decoding iteration is an even half-iteration, and the second half of the decoding iteration is an odd half-iteration.

5. The turbo decoder of claim 1, wherein each of the first and second pluralities of extrinsic memory banks is configured to organize data according to an R×C matrix having a format similar to that of an interleaver table.

6. The turbo decoder of claim 1, wherein the first plurality of extrinsic memory banks and the second plurality of the extrinsic memory banks are the same plurality of extrinsic memory banks.

7. The turbo decoder of claim 1, wherein the first or second plurality of extrinsic memory banks comprises dual-port memory bank.

8. A turbo decoder comprising:
a plurality of maximum a posteriori (MAP) engines;
a first plurality of extrinsic memory banks and a second plurality of extrinsic memory banks; and
wherein each of the first and second pluralities of extrinsic memory banks is accessible by at least one of the plurality of MAP engines, the turbo decoder further comprising:
a plurality of systematic memory banks;
a plurality of parity memory banks; and
wherein the turbo decoder is configured such that during decoding:
in a first half of a decoding iteration, a MAP engine of the plurality of MAP engines:
(i) receives as input systematic bits si from a systematic memory bank of the systematic memory banks, a priori data ei from the first plurality of extrinsic memory banks, and parity-1 bits pi from a first parity memory bank of the plurality of parity memory banks,
(ii) generates v'i=si+e'i, and
(iii) stores v'i in the second plurality of extrinsic memory banks, where e'i is the a priori information generated by the MAP engine during the first half of the decoding iteration, and
in a second half of a decoding iteration, the MAP engine:
(iv) receives as input interleaved data vj from the second plurality of extrinsic memory banks, and parity-2 bits pj from a second parity memory bank of the plurality of parity memory banks,
(v) generates extrinsic data e'j, and
(vi) stores e'j in the first plurality of extrinsic memory banks.

9. A method of decoding using a turbo decoder comprising N MAP engines,
a first plurality of extrinsic memory banks, and a second plurality of extrinsic memory banks, wherein each of the first and second pluralities of extrinsic memory banks is configured to store and retrieve data according to a R×C matrix having a format similar to that of an interleaver table, the method comprising:
in a first half of a decoding iteration, the N MAP engines reading data from the first plurality of extrinsic memory banks by row according to a first predetermined sequence;
in the first half of the decoding iteration, the N MAP engines writing data to the second plurality of extrinsic memory banks by row according to the first predetermined sequence;
in a second half of the decoding iteration, the N MAP engines reading data from the second plurality of extrinsic memory banks by column according to a second predetermined sequence.

10. The method of claim 9, wherein the interleaver table is formatted in accordance with a 3rd Generation Partnership Project (3GPP) standard.

11. The method of claim 9, wherein the first half of the decoding iteration is an even half-iteration, and the second half of the decoding iteration is an odd half iteration.

12. The method of claim A, wherein the R×C matrix of each of the first and second pluralities of extrinsic memory banks is partitioned into a N×N memory matrix such that each of the first and second pluralities of extrinsic memory banks comprises N row groupings of R/N rows of extrinsic memory and N column groups of C/N columns of extrinsic memory, and wherein the N MAP engines reading data from the first plurality of extrinsic memory banks comprises a kth MAP engine of the N MAP engines reading data from a kth row grouping of the first plurality of extrinsic memory banks, for k=1, 2, 3, 4, . . . N.

13. The method of claim 9, wherein; and in the second half of the decoding iteration, the N MAP engines writing data to the first plurality of extrinsic memory banks by column according to the second predetermined sequence.

14. The method of claim 9, wherein the R×C matrix of each of the first and second pluralities of extrinsic memory banks is partitioned into a N×N memory matrix such that each of the first and second pluralities of extrinsic memory banks comprises N row groupings of R/N rows of extrinsic memory and N column groups of C/N columns of extrinsic memory, and wherein the N MAP engines reading data from the second plurality of extrinsic memory banks comprises a kth MAP engine of the N MAP engines reading data from a kth column grouping of the second plurality of extrinsic memory banks, for k=1, 2, 3, 4, . . . N.

15. The method of claim 9, wherein the R×C matrix of each of the first and second pluralities of extrinsic memory banks is partitioned into a N×N memory matrix such that each of the first and second pluralities of extrinsic memory banks comprises N row groupings of R/N rows of extrinsic memory and N column groups of C/N columns of extrinsic memory, and wherein the N MAP engines writing data to the first plurality of extrinsic memory banks comprises a kth MAP engine of the N MAP engines writing data to a kth column grouping of the first plurality of extrinsic memory banks, for k=1, 2, 3, 4, . . . N.

16. The method of claim 9, wherein the first plurality of extrinsic memory banks and the second plurality of the extrinsic memory banks are the same plurality of extrinsic memory banks.

\* \* \* \* \*

UNITED STATES PATENT AND TRADEMARK OFFICE
CERTIFICATE OF CORRECTION

PATENT NO. : 8,819,517 B1
APPLICATION NO. : 13/006359
DATED : August 26, 2014
INVENTOR(S) : Yuan Li, Tao Zhang and Jianbin Zhu Page 1 of 1

It is certified that error appears in the above-identified patent and that said Letters Patent is hereby corrected as shown below:

In the Specification

Column 10, line 31, delete "⌈CU = C/2⌉" and write "CU = ⌈C/2⌉" in place thereof.

Column 13, line 21, delete "$(s()_j)_{j\in\{0,1,\cdots,p-2\}}$" and write "$(s(j))_{j\in\{0,1,\cdots,p-2\}}$" in place thereof.

Column 13, line 24, delete "$(T())_{l\in\{0,1,\cdots,R-1\}}$" and write "$(T(l))_{l\in\{0,1,\cdots,R-1\}}$" in place thereof.

Column 13, line 25, delete "$(U_l()_j)_{j\in\{0,1,\cdots,R-1\}}$" and write "$\{U_l(j)\}_{l\in\{0,1,\cdots,R-1\}}$" in place thereof.

In the Claims

Column 20, line 49, Claim 12, delete "claim A" and write "claim 9" in place thereof.

Signed and Sealed this
Seventh Day of April, 2015

Michelle K. Lee
*Director of the United States Patent and Trademark Office*